United States Patent [19]
Ragard et al.

[11] 4,135,558
[45] Jan. 23, 1979

[54] MULTIPLE LEAD CUT AND CLINCH MECHANISM

[75] Inventors: Phillip A. Ragard, Binghamton, N.Y.; Crawford A. Matson, Wyalusing, Pa.

[73] Assignee: Universal Instruments Corporation, Binghamton, N.Y.

[21] Appl. No.: 883,242

[22] Filed: Mar. 3, 1978

Related U.S. Application Data

[63] Continuation of Ser. No. 773,347, Mar. 1, 1977, abandoned.

[51] Int. Cl.² .............................................. B21F 1/00
[52] U.S. Cl. .................................... 140/105; 29/566.3
[58] Field of Search ............................. 140/105, 93 D; 29/566.3, 33 M; 72/325, DIG. 10; 227/155

[56] References Cited

U.S. PATENT DOCUMENTS

| 3,429,170 | 2/1969 | Romeo | 29/566.3 X |
| 3,646,659 | 3/1972 | Ragard | 29/752 X |
| 3,986,533 | 10/1976 | Woodman, Jr. | 29/566.3 X |

*Primary Examiner*—Gil Weidenfeld
*Attorney, Agent, or Firm*—Fidelman, Wolffe & Waldron

[57] ABSTRACT

An electronic component lead cutting and clinching mechanism having means for operating substantially simultaneously on a plurality of aligned leads. The cutting edges are angularly oriented to align with the component leads and raised to a position adjacent the undersurface of the wiring board into which the component leads have been inserted. Pneumatic cylinders actuate the mechanism.

14 Claims, 6 Drawing Figures

MULTIPLE LEAD CUT AND CLINCH MECHANISM

This is a continuation of application Ser. No. 773,347 filed Mar. 1, 1977, now abandoned.

BACKGROUND OF THE INVENTION

In the field of electronic component assembly and insertion, a major step in inserting components into circuit boards is the severing of the extra lead material (needed for handling and processing of the components up to and including insertion) and clinching the remaining leads underneath the circuit board. While clinching is not always performed, as where the completed circuit board is passed over a solder bath, the cutting of the leads is always a necessary step.

In the past, numerous devices have been designed to accomplish the cutting function, one lead at a time or two leads at a time using two identical cutting devices in coordinated operation. The electric component lead cut and clinch mechanism shown and disclosed in U.S. Pat. No. 3,646,659 entitled "Lead Cut and Clinch Mechanism" is an example of the latter case. With the increasing usage of electronic modules having a large plurality of leads aligned in single or double rows, the prior cut and clinch methods have been time consuming and inefficient. Additionally, there is a propensity toward designing electronic circuit boards which have components mounted and their leads aligned on the boards at various orientations other than parallel to the X axis of the board; namely, at 45°, 90° and perpendicular to the axis.

What is needed is a mechanism which can cut and clinch a substantial quantity of aligned component leads in a single operation and cut and clinch aligned leads regardless of their orientation to the board axis.

The present invention overcomes the limitations of the prior technology as discussed above. Generally, it consists of a linkage mechanism mounted on a vertically movable and axially rotatable housing assembly. The linkage mechanism to which the shearing and clinching elements are attached, is powered by a pneumatic cylinder which provides sufficient energy to sever a row of the largest diameter leads now in use. A second pneumatic cylinder via a linkage translates a shaft to which the housing assembly is attached, causing the housing assembly to be vertically raised or lowered. A third pneumatic piston drives a rack and pinion gear attached to the same shaft which supports the housing whereby the housing assembly is rotated relative to the circuit board into which parts are being inserted.

Accordingly, it is an object of this invention to provide an electrical lead cutting and clinching assembly which is capable of simultaneously severing a large number of aligned large diameter leads.

It is a further object of this invention to provide an electrical lead cutting and clinching assembly which is adjustable as to the distance from a circuit board and in the length of its actuating strokes.

It is still further object of this invention to provide an electrical lead cutting and clinching mechanism which provides adjustment of the cutting edges to coincide with the angle of component lead alignment.

These and other objects of the invention will be readily apparent during the following discussion taken with reference to the accompanying drawing in which.

DESCRIPTION OF THE INVENTION

Figure 1:
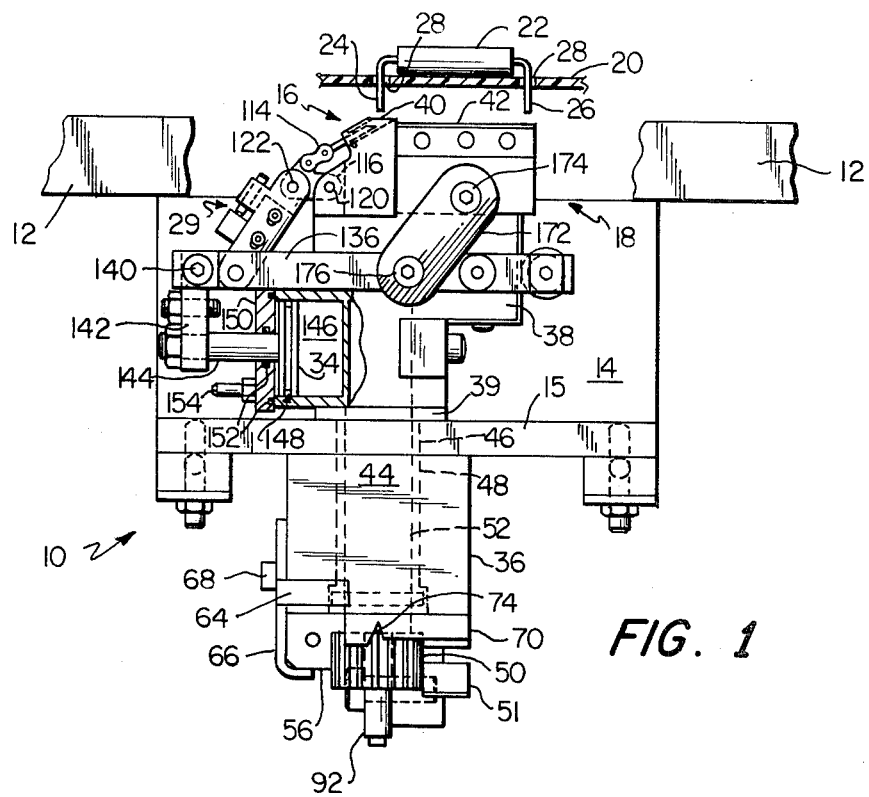
FIG. 1 is a simplified front elevation of the cut and clinch assembly of this invention with some parts partially cut away and parts omitted.

Referring now to the figures, there is shown the cut and clinch assembly 10 of this invention. The assembly is mounted in a component insertion machine 12 and rigidly attached thereto by means of hangers 14 supporting a rigid mounting plate 15. The single lead shearing device 16 and the multiple lead shearing device 18 are beneath the circuit board 20 in which an electronic component, designated as 22, is inserted with its leads 24, 26 extending through predrilled holes 28 in the board 20 in the well known manner. As explained hereinafter, the shearing devices 16, 18 act to first shear the leads 24, 26 close to the board 20 and then bend the remaining lead stub against the undersurface of the board 20, thereby securing the component 22.

A tapereader or computer (not shown) controls the insertion machine and on command rotates the cut and clinch assembly 10 to a programmed position by action of the first pneumatic piston 30 and moves the board 20 on an X-Y table (not shown) to a point where the leads 24, 26 align over openings in the cutting devices 16, 18 respectively. The cut and clinch devices 16, 18 rise by actuation of the second pneumatic cylinder 32 until the leads 24, 26 enter into the shearing devices 16, 18. The linkage drive assembly 29 is then actuated by the third pneumatic piston 34 to sever and clinch the leads 24, 26 whereupon the cut and clinch devices 16 and 18 are lowered and the board 20 may be commanded to another X-Y position for cutting and clinching other leads. For the sake of clarity, the cylinder 30 for rotation is now shown in FIG. 1.

The mounting plate 15 is firmly supported to the main structure of the machine 12 by means of the aforementioned hangers 14 at each side. The lower housing assembly 36 is rigidly fastened to the mounting plate 15 by any suitable means (not shown) such that the machine structure 12, hangers 14, plate 15 and lower housing 36 comprise a rigid assemblage which provides for mounting of other components and provides a fixed reference for the vertical and rotational motions of the cutting and clinching devices 16, 18, as disclosed hereinafter.

The upper housing assembly 38 rests atop the surface of the mounting plate 15 and provides support for the shearing devices 16, 18. A flat bushing 39, between the upper housing assembly 38 and mounting plate 15, provides a bearing surface for rotation of the housing 38. The uppermost surfaces 40, 42 of the shearing devices 16, 18 are generally parallel with the circuit board 20 (as seen in FIG. 1) and substantially equidistant from the board 20 whereby leads of equal length enter into the shears simultaneously when the shearing devices are raised, and shearing leaves lead stubs of equal length for clinching.

ROTATION

An elongated vertical shaft 44 is rigidly but removably attached in conventional manner, e.g. a flat on the shaft and a block, near the base of the upper housing 38. The shaft 44 extends continuously downward from the upper housing 38, through a circular opening 46 in the mounting plate 15, through a circular opening 48 in the lower housing 36, and extends below the lower housing 36. A pinion gear 50 is rigidly but removably attached in coaxial alignment at the lower end of the shaft 44, and a sleeve 52 lines the openings 46, 48 and provides a sliding fit for the shaft 44. An integral, radially oriented, V-shaped elongated horizontal handle 51 extends with apex upward from the periphery of the pinion gear 50, for the purpose of locking the angular position of the shaft 44 as explained hereinafter.

A rack 54 with vertically oriented teeth engages the teeth of the pinion gear 50 and is connected to the pneumatic cylinder 30 via a T-nut 56. The shaft 58 of the pneumatic cylinder 30 is threaded into the T-nut 56 and locked by a nut 60; the shaft 58 is turned and locked to provide a reference angular setting on the pinion 50, its shaft 44, and the upper housing 38. The pneumatic cylinder 30 is rigidly secured to the lower housing 36 by means of a bolt 62, passed through an extension 64 from the lower housing 36, and threaded into the body of the pneumatic cylinder 30. A gib 66 rigidly attached to the lower housing 36 by a bolt 68 cradles the rack 54 and holds it in fixed sliding relationship to the lower housing 36.

Figure 2:
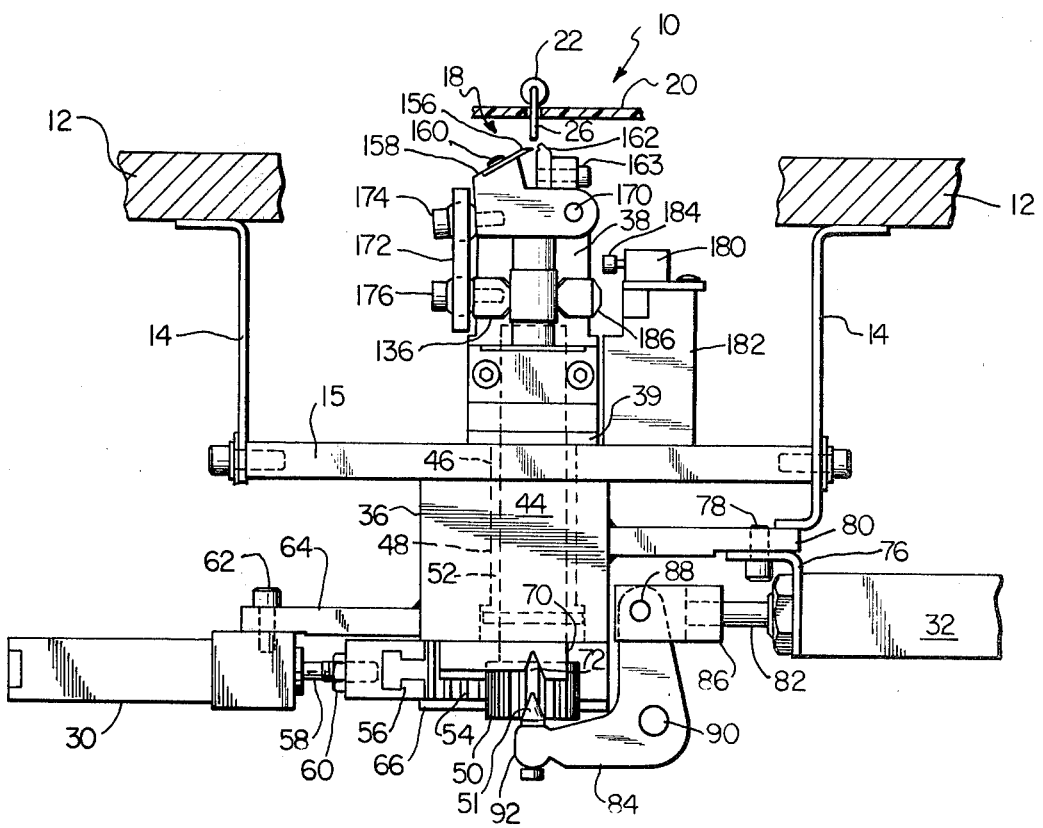
FIG. 2 is a simplified right side view of the assembly of FIG. 1 with some parts omitted.

Actuation of the cylinder 30 extends the cylinder shaft 58, translates the rack 54 to the right as seen in FIG. 2 and causes the pinion gear 50 to rotate and thereby rotate the attached upper housing 38. Retraction of the cylinder shaft 58 rotates the upper housing in the opposite direction. A lock block 70 attaches to the base of the lower housing 36 and provides V-notch sections 72, 74, root up, which extend horizontally in the lock block 70. The lock block 70 partially surrounds the pinion gear 50 but is cut out to prevent interference between the gear 50 and the block 70. The V-notches 72, 74 radiate as from the centerline of the vertical shaft 44 and gear 50 such that the notches 72, 74 align with the gear handle 51 when the gear 50 holds the upper housing 38 with its shearing devices 16, 18 in preferred angular positions, e.g. 0 and 90°, relative to the circuit board 20. when the shaft 44 is raised, as explained hereinafter, the V-handle 51 engages a V-notch 72, 74 with the apex of the handle 51 extending to the root of the V-notch, and the shearing devices 16, 18 are thereby precisely and rigidly held in the preferred angular position. Imprecision in angular positioning due to backlash in the rack and pinion teeth is avoided.

VERTICAL POSITIONING

The other pneumatic cylinder 32 is rigidly attached via a bracket 76 and threaded bolt 78 to another extension 80 from the lower housing 36. Retraction of the cylinder shaft 82 causes the arm 84, via a clevis 86 and pin 88 is pivot about the fixed pivot pin 90. The hammer 92 at the left end of the arm 84 (as seen in FIG. 2) rises, pressing upwardly against the flat bottom surface of the pinion gear 50. This upward motion of the hammer 92 causes the internal shaft 44 to rise carrying along the attached upper housing 38 and shearing devices 16, 18. The upward motion terminates when the upper shear surfaces 40, 42 are suitably positioned adjacent the circuit board 20 for shearing and clinching the leads 24, 26. The upward motion of the hammer 92 also causes the V-handle 51 of the gear 50 to index in one of the V-notches 72, 74 of the lock block 70, as discussed above. The extent of upward movement of the hammer 92 is adjusted by varying the distance that cylinder shaft 82 is threaded into the clevis 86.

The return of the cylinder shaft 82 and consequent lowering of the shearing devices 16, 18 is effected by reversal of the pressure on the faces of the piston within the pneumatic cylinder 32 in the known manner. The return of the shaft 58 of the rotating force cylinder 30 is similarly effected. However, it should be noted that in alternative embodiments of this invention spring loaded pistons may be used to cause shaft return. Also, it should be understood that instead of said pneumatic pistons 30, 32, solenoids, stepper motors and other types of linear actuators known in the art may be used in alternative embodiments of this invention.

SHEARING DEVICE 16

The single lead shearing device 16 is comprised (FIG. 1, 3) of a cutter which has a generally cylindrical shaft 96 terminated at one end by a bevel surface 98 intersecting a transverse surface 100. The other end of the cutter is a journal 102 providing connection for a linkage pin 104, as explained more fully hereinafter. The cutter shaft 96 slides in a generally cylindrical bushing 106 which is beveled at its upper surface 40, said surface 40 being parallel to the circuit mounting board 20 and to the bevel surface 98 of the shaft 96. The bushing 106 is mounted in an opening at the upper end of the upper housing assembly 38 and is retained in position by a key pin 108. When the upper housing 38 is elevated, a cutout 110 in the lower surface of the bushing 106 allows passage therethrough of the depending lead 24 of the electronic component 22 inserted through the predrilled hole 28 in the circuit board 20. The lead 24 is cutoff and clinched when the cutter 96 is driven upward to shear the lead 24 and to bend the remaining stub against the underside of the circuit board 20. The sheared-off lead portion falls into a chute indicated generally by the reference number 112 and is conveyed away from the cutting device 16. Holding means (not shown) prevent movement of the component 22 during the cutting and clinching operation.

Figure 4:
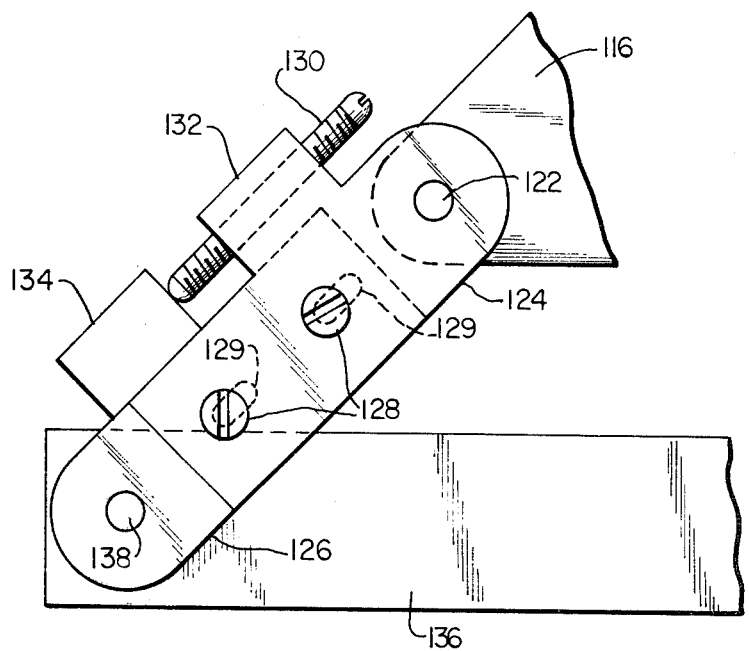
FIG. 4 is an adjustable connector link of the assembly of FIG. 1 to an enlarged scale.

The cutter 96 is pivotably connected to a link 114 by the pin 104. The other end of the link 114 is pivotably connected by the pin 118 to the triangular pivot member 116 which is pivotably connected to the upper housing 38 by means of the pin 120. The third corner (FIGS. 1, 4) of the triangular pivot member 116 is pivotably connected by the pin 122 to a linkage comprised of the connector 124 joined to a similar connector 126 by two bolts 128 with nuts (not shown). The bolt holes 129 in the connector 126 are elongated so the overall length of the linkage is variable by adjusting the bolt 130 which is threaded through the boss 132 atop the connector 124 and integral therewith and acts upon an opposing surface in the boss 134 atop the connector 126 and integral therewith. The connector 126 is pivotably linked to the horizontal slide 136 by the pin 138. The horizontal slide 136 is pivotably connected by the pin 140 to the connector 142 which in turn is rigidly fastened to the shaft 144 of the pneumatic piston 34. The piston 34 slides in the horizontal cylinder 146 which is formed into the upper housing 38. The piston 34 is slidably sealed against the walls of the cylinder 146 by means of 0 rings 148 seated in grooves on the peripheral edge of the piston 34 in the known manner. The cylinder 146 is closed by the back plate 150 which also provides 0 ring seals 152 against the piston shaft 144 and cylinder edges. A valve fitting 154 through the back plate 150 permits entrance of pressurized gas from a connected source (not shown) to the back of the piston 34 whereby the piston 34 is driven forward in the cylinder 146.

As the piston 34 moves forward (to the right as seen in FIG. 1) the pin 140 moves along a parallel path causing the pin 122 to move upwardly via the connectors 124, 126 and the fixed pivot pin 120. Rotational motion of the triangular pivot plate 116 and translation of the link 114 cause the cutter 96 to move upward through the bushing 106 to shear and clinch the component lead 24, as discussed above.

SHEARING DEVICE 18

Figure 5:
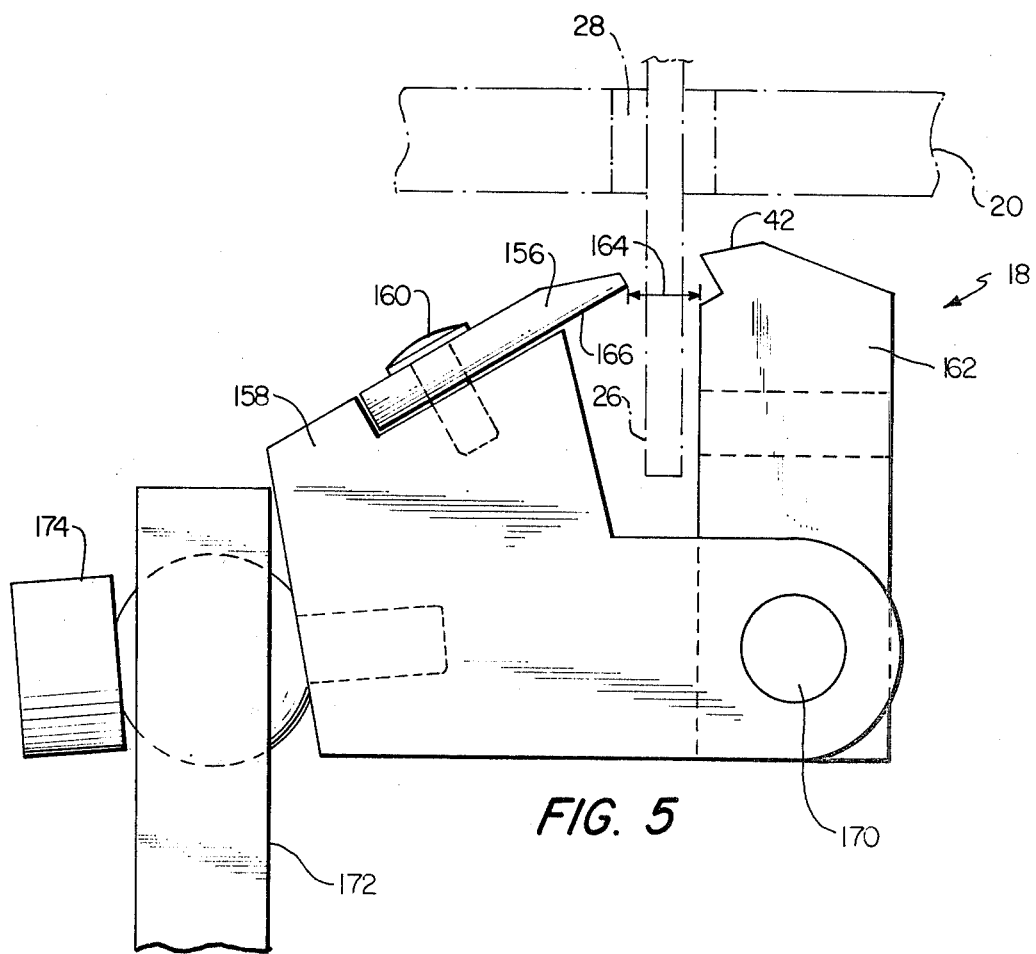
FIG. 5 is the multiple lead cutting device of FIG. 2 to an enlarged scale.

The multiple lead shearing device 18 is comprised (FIG. 5) of a cutting blade 156 of extended length mounted rigidly, but removably, to the holder 158 by bolts 160. A shear 162 of length substantially commensurate with the length 188 of the blade 156 opposes the blade 156 and is rigidly but adjustably attached to the upper housing 38 by a pair of bolts 163. The upper extremity of the blade 156 and the shear 162 are spaced apart one from the other by a distance 164 which allows entry therebetween of the aligned leads, or a single lead 26, of an electronic component 22. The lower surface 166 of the blade 156 inclines from the horizontal and the upper shear surface 42 is sloped substantially parallel to said lower blade surface 166. The blade holder 158 is pivotably attached to the upper housing 38 by the pivot pin 170 and when the holder 158 is pivoted upward the blade 156 moves across the shear 162, first cutting the electronic component leads positioned therebetween and then bending the remaining lead stubs against the bottom of the circuit board 20. The holder 158 is pivotably connected by the pin 174 to the drive link 172 which in turn is connected pivotably at its other end to the horizontal slide 136 by means of pivot pin 176. When the slide 136 advances due to actuation of the piston 34, as aforesaid, the pin 174 is caused to rise in turn pivoting the blade holder 158 on the pin 170 whereby the component leads are cut and clinched.

Figure 3:
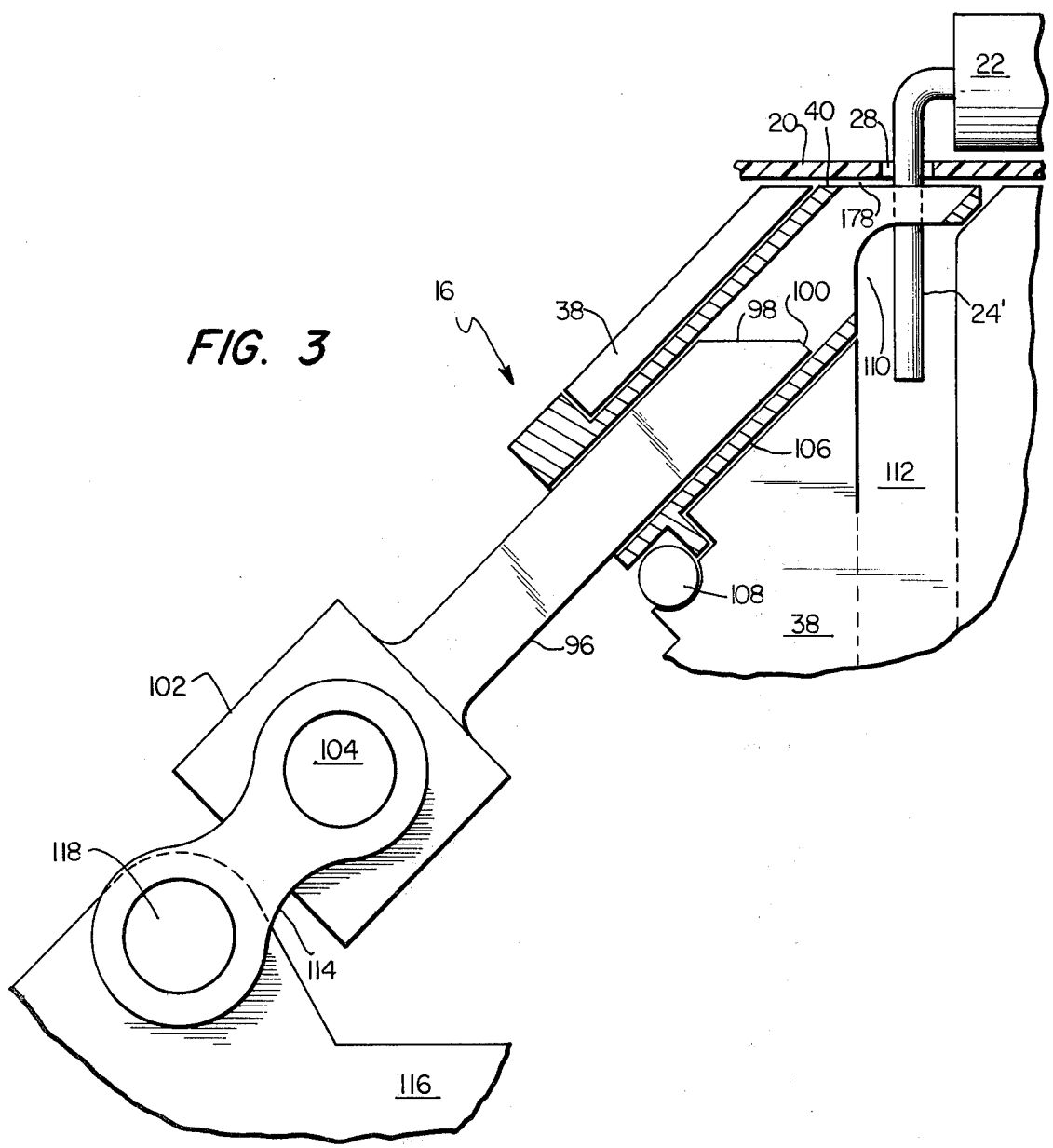
FIG. 3 is the single lead cutting device of FIG. 1 to an enlarged scale and partially in cross section.
Figure 6:
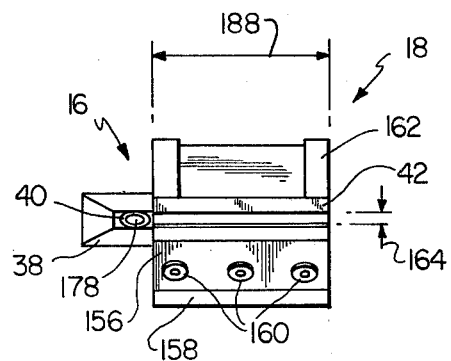
FIG. 6 is the top view of the cutting devices of FIG. 1 to an enlarged scale.

Both cutting devices 16, 18 are actuated by motion of the same piston 34, therefore all leads are operated upon substantially simultaneously. It should be noted (FIG. 2) that the pins 174, 176 engaging the drive link 172 provide a ball surface for pivoting upon whereby the drive link 172 is not constrained to a single plane during its motion but readily follows the path of the blade holder 158. Also, as seen in FIG. 3, the top opening 178 in the single lead cutting device 16 aligns with the gap 164 between the parallel opposed blade 156 and the shear 162, whereby one end lead of an electronic component 22 may be aligned for cutting by the single lead cutting device 16 and the other end lead, or a plurality of aligned leads, may be simultaneously positioned for cutting by the multiple lead shearing device 18. The top opening 178 in the cutter 96 is centered on the rotational axis of the vertical shaft 44 whereby the computer program may rely on one component end lead as the reference in commanding the X-Y position of the circuit board 20, and the angular position of the shaft 44. As is well known in the art the positions of the assembly 10 may be detected by sensors which must be activated before a subsequent step of operation is commanded.

For example, in FIG. 2, a microswitch 180 mounted to the mounting plate 15 by means of a post 182 will sense the proper vertical positioning of the upper housing 38 prior to cutting by the contact of the feeler 184 with the button 186 on the upper housing 38.

OPERATION

In operation the computer (not shown) will cause the circuit board 20, mounted to the X-Y table (not shown) of the component insertion machine 12, to be positioned with one vertical lead 24 of a component 22 aligned to the upper opening 178 in the single lead cutting device 16. Cylinder 30 is then actuated to rotate the upper housing 38 via the rack 54 and pinion 50, thereby angularly aligning the gap 164 to receive the other lead 26 of the component 22. Because of the extended length 188 of the cutter blade 156 and the opposed shear 162, a plurality of aligned leads can be accommodated simultaneously for components having a plurality of in-line leads. Then the cylinder 32 is actuated to raise the cutting devices 16, 18 until the upper surfaces 40, 42 of the cutting devices 16, 18 support the undersurface of the circuit board 20 and the leads are received within the cutting devices 16, 18. The pneumatic piston 34 is actuated to cut and clinch the leads whereafter, pressure on the piston 34 is reversed in the known manner causing the cutting devices to revert to their original condition. Then the cylinder 32 is returned to its original position to lower the upper housing 38 after which the X-Y position of the circuit board may be changed for operation on other component leads as aforesaid.

In an embodiment of this invention which performs satisfactorily a pneumatic source at 60 psi enabled simultaneous cutting of up to sixteen leads of 0.008 inch X 0.14 inch KOVAR or three leads of 0.047 inch diameter steel and 80 psi cut up to twenty-two KOVAR leads or four steel leads of the above dimensions respectively.

The cut and clinch assembly 10 of this invention is not to be considered as limited to the embodiment described above. For example, in an alternative embodiment of the cut and clinch assembly 10 of this invention, the single lead cutting device 16, and all linkages exclusively associated therewith, may be omitted. Operation of this alternative device is similar to that of the embodiment described above, except that the computer commands the X-Y table positioning such that the component lead which in the first embodiment entered the opening 178 in the single lead cutting device 16, now enters within the multiple lead cutting device 18 along with all other aligned leads.

In still another alternative embodiment the lock block 70, which in the above described embodiment had two V-notches 72, 74 permitting two angular orientations at 90° from each other, has a plurality of V-notches permitting a plurality of angular positions relative to the X axis of the circuit board 20, e.g., 0°, 45°, 90°, 135°, −45°.

It should also be understood that the cut and clinch mechanism of this invention may be used with component insertion machines operating under completely automatic control, e.g. computer control, as indicated above, on semi-automatic machines, an with machines where component insertion and manipulation of the circuit board is accomplished manually.

It will, of course, be obvious to those skilled in the art that many other changes, modifications and refinements may be made to the assembly without departing from the scope of the appended claims.

What is claimed:

1. A mechanism for cutting and clinching at least one lead of a plurality of aligned leads of an electronic component, said leads inserted and projecting beneath a circuit board, said mechanism including:
   a first housing assembly, said first housing assembly mounted to be raised and lowered vertically and for positioning angularly by rotation about a vertical axis within said first housing assembly;
   a multiple lead cutting and clinching device, said cutting and clinching device attached to said first housing assembly and moving angularly and vertically therewith and positioned below said circuit board, said cutting and clinching device comprising a pivotably mounted cutting blade of extended length and a shear of substantially equal length, edges of said blade and said shear being parallel and space apart to admit at least one of said component leads therebetween, said blade passing in an arc over said shear in cutting relationship to cut and clinch at least one lead from said plurality of leads when said cutting and clinching device is actuated to pivot said cutting blade;
   means to angularly position said first housing assembly, whereby said multiple lead cutting and clinching device is aligned to said plurality of aligned leads;
   means to vertically raise and lower said first housing assembly; and
   means to actuate said cutting and clinching device.

2. The mechanism of claim 1 wherein said means to vertically raise and lower said first housing assembly comprise first piston means and first linkage means, said first piston means actuating said first linkage means, said first linkage means connected to said first housing assembly.

3. The mechanism of claim 2 wherein said first linkage means is of adjustable length whereby the distance of raising and lowering said first housing assembly is varied.

4. A mechanism for cutting and clinching a plurality of aligned leads of an electronic component, said leads inserted and projecting beneath a circuit board, said mechanism including:
   a first housing assembly, said first housing assembly mounted to be raised and lowered vertically and for positioning angularly by rotation about a vertical axis within said first housing assembly;
   a multiple lead cutting and clinching device, said cutting and clinching device attached to said first housing assembly and moving angularly and vertically therewith, said cutting and clinching device when actuated cutting and clinching at least one of said plurality of leads;
   means to angularly position said first housing assembly, comprising second piston means, and rack and pinion means, said second piston means actuating said rack and pinion means, said pinion connected to said first housing assembly and coaxial with said vertical axis within said first housing assembly, whereby said multiple lead cutting and clinching device is aligned to said plurality of aligned leads;
   means to vertically raise and lower said first housing assembly; and
   means to actuate said cutting and clinching device.

5. The mechanism of claim 4 wherein the connection between said second piston means and said rack is of variable length whereby said first housing assembly is angularly referenced to said circuit board.

6. The mechanism of claim 4 further comprising:
   a second housing assembly, said second housing assembly providing fixed support for said second piston means and said rack;
   a locking block fixed to said second housing assembly, said locking block having horizontal grooves therein;
   a horizontal handle extending from said pinion, said horizontal handle engaging said horizontal grooves in said locking block when said first housing assembly is vertically elevated, whereby the angular position of said first housing assembly is precisely held.

7. The mechanism of claim 1 wherein said means to actuate said cutting and clinching device comprise third piston means and second linkage means, said third piston means driving said second linkage means.

8. The mechanism of claim 8 and further comprising:
   a single lead cutting and clinching device, said single lead cutting and clinching device attached to said first housing assembly and moving angularly and vertically therewith and positioned below said circuit board, said single lead cutting and clinching device when actuated cutting and clinching one of said plurality of leads; and
   means to actuate said single lead cutting and clinching device.

9. The mechanism of claim 8 wherein said single lead cutting and clinching device comprises a shaft having a beveled cutting and clinching end, said shaft receive within a bore in said first housing assembly.

10. The mechanism of claim 8 wherein said means to actuate said single lead cutting and clinching device comprise said third piston means and third linkage means, said third piston means driving said third linkage means, whereby both of said cutting and clinching devices are actuated substantially simultaneously.

11. The mechanism of claim 8 wherein said means to angularly position, to vertically raise and lower, and to actuate include linear actuator means.

12. The mechanism of claim 8 wherein said multiple lead cutting and clinching device and said single lead cutting and clinching device are aligned whereby leads in a single row are cut substantially simultaneously by both of said cutting and clinching devices.

13. The mechanism of claim 12 wherein the inlet for said one of said plurality of leads in said single lead cutting device is centered coaxially with said vertical axis within said first housing assembly.

14. A mechanism for cutting and clinching a plurality of aligned leads of an electronic component, said leads inserted and projecting beneath a circuit board, said mechanism including:
   a first housing assembly, said first housing assembly mounted to be raised and lowered vertically;
   a multiple lead cutting and clinching device, said cutting and clinching device attached to said first housing assembly and moving therewith and positioned below said circuit board, said cutting and clinching device when actuated cutting and clinching at least a lead from said plurality of leads;
   a single lead cutting and clinching device, said single lead cutting and clinching device attached to said first housing assembly and moving therewith and positioned below said circuit board, said single lead cutting and clinching device when actuated cutting and clinching one of said plurality of leads, the direction of lead clinching by said single lead cutting and clinching device being transverse from the direction of lead clinching by said multiple lead cutting and clinching device.

means to vertically raise and lower said first housing assembly; and means to actuate said cutting and clinching devices whereby leads are cut and clinched transversely.

* * * * *